United States Patent
Germanenko

(10) Patent No.: US 11,581,692 B2
(45) Date of Patent: Feb. 14, 2023

(54) CONTROLLING PRESSURE IN A CAVITY OF A LIGHT SOURCE

(71) Applicant: KLA Corporation, Milpitas, CA (US)

(72) Inventor: Igor Germanenko, San Jose, CA (US)

(73) Assignee: KLA Corp., Milpitas, CA (US)

(*) Notice: Subject to any disclaimer, the term of this patent is extended or adjusted under 35 U.S.C. 154(b) by 567 days.

(21) Appl. No.: 16/719,868

(22) Filed: Dec. 18, 2019

(65) Prior Publication Data

US 2020/0403370 A1    Dec. 24, 2020

Related U.S. Application Data

(60) Provisional application No. 62/862,890, filed on Jun. 18, 2019.

(51) Int. Cl.
| | |
|---|---|
| *H01S 3/036* | (2006.01) |
| *H01S 3/109* | (2006.01) |
| *G01L 15/00* | (2006.01) |
| *G01L 19/00* | (2006.01) |
| *H01L 21/67* | (2006.01) |

(52) U.S. Cl.
CPC ............. *H01S 3/036* (2013.01); *G01L 15/00* (2013.01); *G01L 19/0007* (2013.01); *H01L 21/67288* (2013.01); *H01S 3/109* (2013.01)

(58) Field of Classification Search
CPC ........... H01S 3/036; H01S 3/027; G01L 15/00
USPC ........................................................ 250/338
See application file for complete search history.

(56) References Cited

U.S. PATENT DOCUMENTS

| | | | | |
|---|---|---|---|---|
| 4,977,573 A | * | 12/1990 | Bittenson | ................ H01S 3/134 372/57 |
| 5,642,374 A | * | 6/1997 | Wakabayashi | .......... H01S 3/134 372/57 |
| 6,646,713 B2 | | 11/2003 | Ishii | |
| 6,761,770 B2 | | 7/2004 | Bartholomew et al. | |
| 7,733,475 B2 | | 6/2010 | Chikamatsu et al. | |

(Continued)

FOREIGN PATENT DOCUMENTS

| | | |
|---|---|---|
| CN | 106597607 | 4/2017 |
| CN | 108183382 | 6/2018 |

(Continued)

OTHER PUBLICATIONS

Abstract of Publication No. USH1937H "Laser barometer" by Abercrombie et al. published Feb. 6, 2001, claims priority to U.S. Appl. No. 61/378,496, filed Feb. 29, 1996.

(Continued)

*Primary Examiner* — Tuan N Nguyen
(74) *Attorney, Agent, or Firm* — Ann Marie Mewherter

(57) ABSTRACT

Methods and systems for controlling pressure in a cavity of a light source are provided. One system includes a barometric pressure sensor configured for measuring pressure in a cavity of a light source. The system also includes one or more gas flow elements configured for controlling an amount of one or more gases in the cavity. In addition, the system includes a control subsystem configured for comparing the measured pressure to a predetermined range of values for the pressure and, when the measured pressure is outside of the predetermined range, altering a parameter of at least one of the one or more gas flow elements based on results of the comparing.

26 Claims, 7 Drawing Sheets

(56) References Cited

U.S. PATENT DOCUMENTS

| | | | |
|---|---|---|---|
| 7,760,326 B2 | 7/2010 | Okada | |
| 8,581,140 B2 | 11/2013 | Aso et al. | |
| 9,116,445 B2 | 8/2015 | Germanenko et al. | |
| 2004/0105085 A1* | 6/2004 | Suzuki | G03F 7/70883 |
| | | | 250/548 |
| 2005/0030987 A1 | 2/2005 | Nagai et al. | |
| 2009/0207405 A1* | 8/2009 | Chikamatsu | G01N 21/9501 |
| | | | 356/237.2 |
| 2010/0232469 A1 | 9/2010 | Levatter et al. | |
| 2011/0013653 A1 | 1/2011 | Krausz et al. | |

FOREIGN PATENT DOCUMENTS

| | | |
|---|---|---|
| CN | 207896409 | 9/2018 |
| KR | 10-1249473 | 4/2013 |
| WO | 2019/040300 | 2/2019 |

OTHER PUBLICATIONS

Statler et al., "Design and fabrication of a miniature pressure sensor head using direct bonded ultra-thin silicon wafers," Proceedings of the Ninth Annual International Conference on Microelectromechanical Systems Devices (MEMS '96), San Diego, Calif., Feb. 1-15, 1996, pp. 239-243.
International Search Report for PCT/US2020/037833 dated Sep. 25, 2020.

* cited by examiner

CONTROLLING PRESSURE IN A CAVITY OF A LIGHT SOURCE

BACKGROUND OF THE INVENTION

1. Field of the Invention

This invention generally relates to methods and systems for controlling pressure in a cavity of a light source.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers and other substrates to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

There are a number of variables that can negatively impact the inspection results in ways that limit their usefulness. For example, variations in the processes used to form wafers can cause changes in the wafers (e.g., from wafer-to-wafer and/or across wafer) that do not necessarily cause defects on the wafer but can be detected as such by inspection. Variations in the inspection process or tool can also negatively impact the inspection results. For example, the inspection tool parameters can drift over time, which can affect inspection results. In particular, if an inspection tool parameter shifts unexpectedly, the inspection tool can detect an abnormal number of defects on a wafer, many of which may not actually be defects. If a shift in an inspection tool parameter is undetected and affects the inspection results, the inspection results may be useless and/or be used in a detrimental way to change the process performed on the inspected specimen if it is not obvious from the inspection results that the tool has drifted.

There has therefore been much energy and time devoted to trying to minimize and/or compensate for any non-defect related variations in the inspected specimen and the inspection tool parameters to minimize the effects of such variations on the inspection results. In addition, because many inspection processes and tools are being operated at or near their maximum performance limits, parameter variations that may have once been inconsequential can now have significant negative effects on the inspection results. One such parameter that the inventor has discovered can have a significant negative effect on the inspection results is atmospheric pressure changes in and/or around an inspection tool laser. However, it is not believed that any methods for pressure stabilization are utilized in current lasers. In particular, the current state of the art approach is to compensate for atmospheric pressure changes using optical adjustments within the laser or not to compensate at all.

There are, therefore, a number of disadvantages to the currently used inspection stabilization processes and systems. For example, as noted above, some parameter variations identified by the inventor as potentially problematic are not believed to be monitored or controlled in any way. In addition, currently used methods for compensating for atmospheric pressure changes are not adequate due to relatively slow reaction time, compensation range, and overall complexity of the compensation algorithm. Furthermore, there is no single parameter that can be used in the feedback loop that corresponds to the barometric pressure change.

Accordingly, it would be advantageous to develop systems and/or methods for controlling pressure in a cavity of a light source that do not have one or more of the disadvantages described above.

SUMMARY OF THE INVENTION

The following description of various embodiments is not to be construed in any way as limiting the subject matter of the appended claims.

One embodiment relates to a system configured to control pressure in a cavity of a light source. The system includes a barometric pressure sensor configured for measuring pressure in a cavity of a light source. The system also includes one or more gas flow elements configured for controlling an amount of one or more gases in the cavity. In addition, the system includes a control subsystem configured for comparing the measured pressure to a predetermined range of values for the pressure and, when the measured pressure is outside of the predetermined range, altering a parameter of at least one of the one or more gas flow elements based on results of the comparing. The system may be further configured as described herein.

Another embodiment relates to a computer-implemented method for controlling pressure in a cavity of a light source. The method includes measuring pressure in a cavity of a light source and controlling an amount of one or more gases in the cavity with one or more gas flow elements. The method also includes comparing the measured pressure to a predetermined range of values for the pressure. When the measured pressure is outside of the predetermined range, the method further includes altering a parameter of at least one of the one or more gas flow elements based on results of the comparing.

Each of the steps of the method described above may be performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for controlling pressure in a cavity of a light source. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
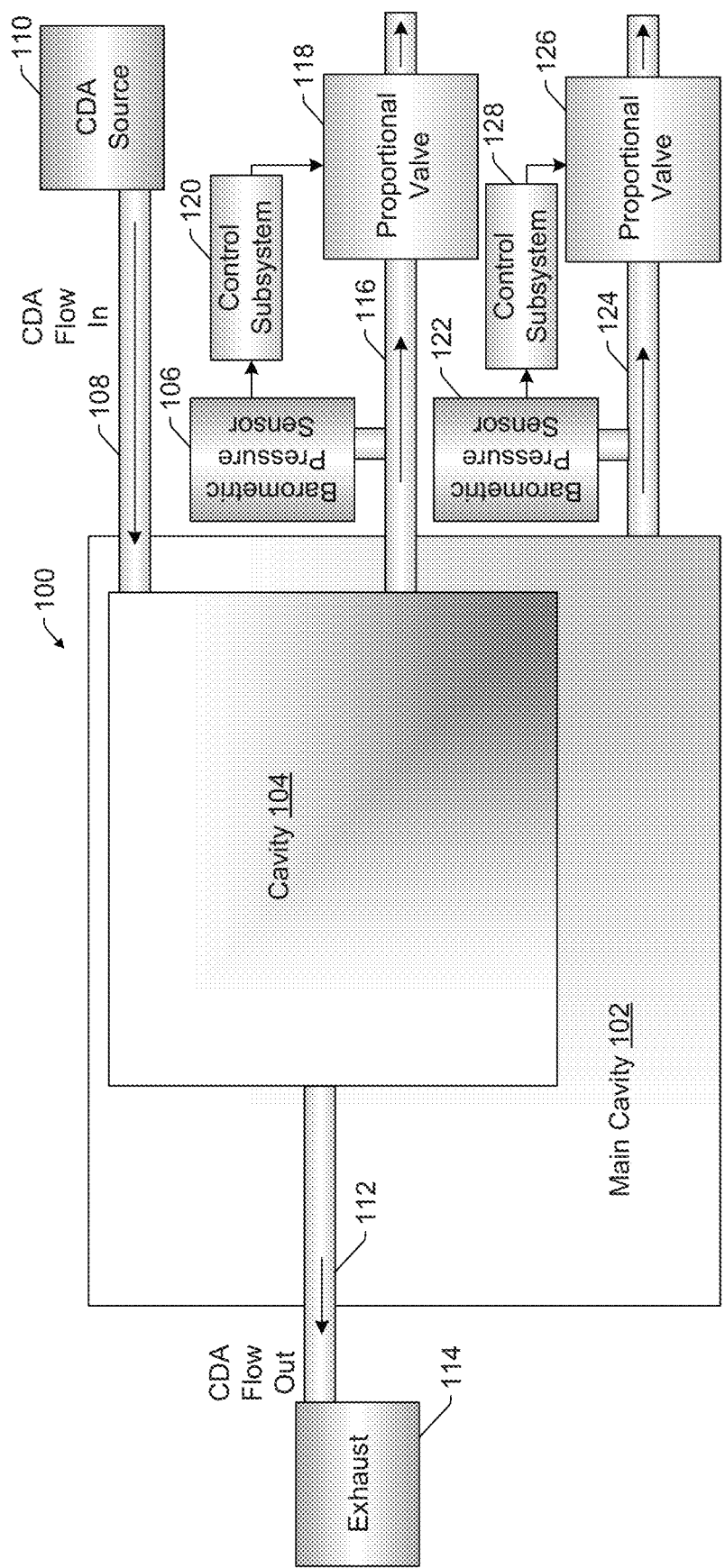
FIGS. 1-2 and 4 are schematic diagrams illustrating side views of embodiments of a system configured to control pressure in a cavity of a light source.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to barometric pressure stabilization for improved laser or other light source performance. The embodiments described herein improve light sources such as lasers in terms of reliability, stability, and increased lifetime. The embodiments are generally configured for controlling barometric pressure inside a laser or other light source housing to make it insensitive to the variation of the atmospheric pressure changes.

Some currently used inspection tools include a laser that performs runtime optimization of an infrared (IR) engine all the time in the background to compensate for barometric pressure changes by optimizing etalon temperature using a thermo-electric cooler (TEC) (e.g., the TECxxxx models commercially available from Thorlabs, Newton, N.J.).

According to data collected by the inventor, pressure drops in a laser were observed to correspond with changes in the atmospheric pressure caused by nearby storms. The pressure drops were correlated with TEC adjustment and total green drop. The inventor also observed that the pressure started to go up, and after the laser was ramped down and up due to spot shift, TEC is also going up, which is a better direction. The laser environmental compensation control drove out of range due to unstable etalon operating set point. It seems that the TEC set point can be too close to the critical temperature (e.g., 20 C) and may need to be adjusted. The set point can be adjusted by running IR optimization.

When the etalon operating set point is unstable or the laser environmental compensation control is otherwise unstable, it can have an impact on the images generated for the specimen using light from the laser. For example, instability in the laser can cause high frequency intensity oscillation in specimen images. The intensity oscillations may appear as vertical banding in specimen images, which can cause changes in the sensitivity of the inspection. In particular, the high frequency intensity oscillations can cause the smallest size defect that can be detected to be larger (meaning that the inspection is less sensitive). Therefore, changes in atmospheric pressure can cause and correspond to reduced defect counts in inspection results. Rather than adjusting the temperature of the etalon to compensate for the barometric pressure changes, the inventor is proposing herein to stabilize the pressure inside the laser head (or other light source) to make the laser (or other light source) more insensitive to the atmospheric changes.

One embodiment relates to a system configured to control pressure in a cavity of a light source. In one embodiment, the light source is a laser configured to generate single wavelength light. In another embodiment, the light source is a laser configured to generate narrowband light. "Narrowband light" is generally defined herein as any light having one or more wavelengths that span a wavelength band of less than 10 nm (e.g., from 190 nm to 200 nm). For example, the embodiments described herein are particularly advantageous for single mode (or single wavelength) narrow band, CW lasers. The light generated by such a laser may be IR, visible, ultraviolet (UV), or deep ultraviolet (DUV) light. The embodiments described herein may be used for multi-mode lasers, but the effects of wavelength dependence on ambient pressure are not particularly critical for such lasers. However, for certain applications even multi-mode, pulsed, or mode-locked lasers can benefit if the wavelength stability of the output light is important. The embodiments may also be used to stabilize pressure in diode and fiber lasers. In general, therefore, the embodiments described herein may be used to control pressure in any light source whose wavelength stability is important and depends on variations in pressure in the light source. Although some of the embodiments may be described herein specifically with respect to lasers, none of the embodiments are limited to laser type light sources.

The embodiments described herein provide different pressure control compared to that performed in some gas lasers such as excimer, argon, etc. lasers. For example, some gas lasers have cavities that contain a gaseous, active medium in which light is generated that is then emitted by the lasers. In such lasers, the pressure of the active medium may be controlled in the cavity in which it is contained (e.g., to control gain the active medium). That pressure is not, however, the pressure being controlled by the embodiments described herein. In particular, the pressure that is controlled by the embodiments described herein is the atmospheric (barometric) pressure in the cavity of the light source. Therefore, the pressure of the gaseous active medium in a laser may be different from the atmospheric pressure in the light source. In one such example, the gaseous active medium may be contained within a cavity in the light source, and the pressure within that cavity may be controlled. However, such pressure control may not affect, control, or otherwise alter the barometric pressure outside of that cavity but within the light source (which may include the barometric pressure in one or more other cavities of the light source). In a similar manner, if the embodiments described herein are used to control a barometric pressure in a cavity of such a light source, the barometric pressure control is designed to not alter a pressure in any gaseous, active medium within that light source. In this manner, the pressure that is controlled by the embodiments described herein does not include the pressure of an active medium in the light source. In addition, the embodiments described herein may be configured to control barometric pressure in a gas laser, a solid state laser, and any other light sources described herein.

In one embodiment, the cavity is a harmonic generation cavity of the light source. For example, the harmonic generation cavity may be a second harmonic generation (SHG) cavity, a third harmonic generation (THG) cavity, a fourth harmonic generation (FHG) cavity, etc. In another embodiment, the cavity is an IR cavity of the light source. In an additional embodiment, the cavity is a main cavity of the light source. For example, as shown in FIG. 1, light source 100, which may be configured as a laser head, may include main cavity 102 and cavity 104. Cavity 104 may be a harmonic generation cavity, an IR cavity, or another type of cavity described herein. A cavity may also include several arrangements of one or more cavities including one or more cavities inside another cavity, e.g., an IR or a harmonic generation cavity inside a main cavity as shown in FIG. 1.

A "cavity" as that term is used herein is generally defined as an enclosure (or partial enclosure) formed by some housing element(s) in which light is generated by a light source. The "cavities" described herein will generally not be empty but may include any elements (not shown) involved in generating light within the cavity that is then transmitted out of the light source (e.g., via a window in the cavity and a window in the housing of the light source) for use in a system such as an inspection system. Therefore, the configuration and elements included in the cavities described herein may vary from light source-to-light source, and the embodiments described herein are not limited in the types or configurations of cavities with which they can be used. Any specific cavities described herein are merely illustrative of the types of light sources and their cavities that may particularly benefit from the barometric pressure control described herein.

The system includes a barometric pressure sensor configured for measuring pressure in a cavity of a light source. For example, as shown in FIG. 1, the system may include barometric pressure sensor 106 configured for measuring pressure in cavity 104 of light source 100. This barometric pressure sensor and any other barometric pressure sensors described herein may include any suitable commercially available barometric pressure sensors known in the art. One example of a suitable commercially available barometric pressure sensor is the GE Druck PMP5073 pressure transmitter that is commercially available from Cole-Parmer, Vernon Hills, Ill. Barometric pressure sensor 106 and various configurations of this and other barometric pressure sensors are described further herein.

The system also includes one or more gas flow elements configured for controlling an amount of one or more gases in the cavity. Multiple suitable configurations for the one or more gas flow elements are described further herein. In general, the gas flow element(s) may include any gas flow elements that can cause one or more gases to flow into and/or out of the cavity whose barometric pressure is being controlled. The one or more gas flow elements also preferably include one or more elements that can be used to create a particular pressure (positive or negative) in the cavity of the light source in response to control signals, values, instructions, etc. from the control subsystem described further herein. The one or more gases may include any suitable gases, one particularly suitable example of which is clean dry air (CDA).

The system further includes a control subsystem configured for comparing the measured pressure to a predetermined range of values for the pressure and, when the measured pressure is outside of the predetermined range, altering a parameter of at least one of the one or more gas flow elements based on results of the comparing. Multiple suitable configurations for the control subsystem are described further herein. The control subsystem may include only mechanical elements, only computer elements, or different types of elements. The control subsystem may also be digital or analog. The predetermined range of values for the pressure may be determined by a user and may in some instances include a single value for the pressure but more likely will include a least some range of values for the pressure. The range of values may be relatively small or relatively large depending on how well the pressure can be controlled by the elements in the system and/or depending on how well the pressure needs to be controlled to ensure relatively stable performance of the light source and therefore the system in which it is included.

The parameter of the at least one gas flow element that is altered by the control subsystem may include any suitable parameter that can cause a change in pressure in the cavity of the light source, some examples of which are described further herein and which may vary depending on the configuration of the gas flow elements. The alterations to the parameter of the at least one gas flow element may be determined in any suitable manner (e.g., experimentally or theoretically) using any suitable type of control loop, algorithm, method, function, etc. In one embodiment, the control subsystem is configured for altering the parameter using a proportional-integral-derivative (PID) control loop. For such a control loop, the control subsystem may include a current amplifier and controller (not shown) between the barometric pressure sensor and a gas flow element such as a valve to set proper PID gains for the control loop. The control subsystem may also be configured to perform a calibration procedure on the barometric pressure sensor and the gas flow element(s). The calibration procedure may be performed in any suitable manner known in the art.

In one embodiment, the one or more gas flow elements comprise a first gas flow conduit coupled to the cavity and a CDA source. Such gas flow element(s) also include a second gas flow conduit coupled to the cavity and an exhaust. The first and second gas flow conduits, the CDA source, and the exhaust are configured to cause a positive pressure in the cavity. For example, as shown in FIG. 1, the gas flow elements may include gas flow conduit 108 coupled to cavity 104 and CDA source 110 and gas flow conduit 112 coupled to cavity 104 and exhaust 114. Gas flow conduit 108 may be configured to provide CDA flow into cavity 104 from CDA source 110, and gas flow conduit 112 may be configured to provide CDA flow out of the cavity. Although the gas flow conduits are shown being in physical contact with the cavity itself, the gas flow conduits may be coupled to the cavity without being physically coupled to the cavity itself. For example, the gas flow conduits may be coupled to the cavity by being in physical contact with and coupled to the housing of the light source (e.g., via openings created in the light source housing); and by causing gas to flow into and out of the housing, the conduits and the gas flow therein may cause a positive pressure in the cavity. Therefore, the gas flow conduits may be coupled to the cavity without physically contacting the cavity via the gas flow into and out of the gas flow conduits.

The gas flow in and out of the gas flow conduits may have any suitable parameters, which may vary depending on the cavity and the gas flow elements. In one non-limiting example provided only for illustrative purposes, the CDA flow in may have a volumetric flow rate of about 1.5 liters per minute (LPM) and a pressure of about 50 psig, and the CDA flow out may have a volumetric flow rate of about 0.5 LPM and an unregulated pressure. The laser head may be purged with CDA to slightly raise the pressure inside the head to about 1 atm. In this manner, the pressure inside the laser head may be set above 1 atm. It is noted here that the above absolute values in additional to any and all other absolute values provided herein are merely to illustrate and describe the invention, but not to limit the invention to any particular absolute values. For example, suitable absolute values of the parameters described herein may be different for different light source types and even different light source units (of the same make and model). In addition, the pressure that is created in the cavity in the light source may be above or below atmospheric (e.g., where below atmospheric may be created by generating a vacuum in the cavity via one or more gas removal elements such as a pump) as long as it is stable via the control described herein. The first and second gas flow conduits and any other conduits described herein may have any suitable configuration known in the art (e.g., tubes or pipes made of any suitable materials and having any suitable dimensions and other flow characteristics).

In one such embodiment, the one or more gas flow elements also include a purge conduit coupled to the cavity and a proportional valve coupled to the purge conduit, and the parameter altered by the control subsystem is a parameter of the proportional valve. For example, as shown in FIG. 1, the gas flow element(s) may include purge conduit 116 coupled to cavity 104 and proportional valve 118 coupled to the purge conduit. The purge flow through the purge conduit may have any suitable parameters, which may vary depending on the cavity and the gas flow control. In one non-limiting example provided only for illustrative purposes, the purge flow out may have a volumetric flow rate of about 0.5 LPM and a pressure of about 16 psia. The purge conduit may be configured to purge the gases from the cavity out to the atmosphere. The purge conduit may be further configured as described herein with respect to other gas flow conduits. The proportional valve may include any suitable proportional valve known in the art.

As further shown in FIG. 1, the system includes control subsystem 120 coupled to barometric pressure sensor 106 and proportional valve 118. The control subsystem may include any suitable elements such as those described further herein that can receive a pressure measurement from the barometric pressure sensor and, based on the measured pressure, send a control signal (e.g., a control voltage between 0 and 5 V) to proportional valve 118 if the measured pressure is outside of the predetermined range. In this manner, the pressure inside the light source is adjusted to stabilize at the set point. For example, the basic principle of operation of the system shown in FIG. 1 is that the control subsystem causes the proportional valve to open or close based on a control signal determined from the pressure measured by the barometric pressure sensor. In one such example, the barometric pressure sensor measures the pressure inside the light source (or in a cavity in the light source), and via a control loop, the control subsystem adjusts the proportional valve connected before the CDA exhaust (not shown). When the control loop closes the valve, the pressure increases, and when the control loop opens the valve, the pressure decreases. Closing and opening the valve may also include only partially closing and opening of the valve, respectively. Such operation of the proportional valve allows substantially precise control of the pressure inside the laser head and makes it insensitive to any atmospheric variations that may be occurring. In particular, the substantially stable pressure inside the light source makes the light source substantially insensitive to atmospheric effects during operation. In this manner, the proportional valve can be used to adjust CDA exhaust flow to thereby control the pressure in the light source or a cavity in the light source. As a result, the internal pressure in cavity 104 can be maintained at a stable set point (e.g., about 1 atm).

In another such embodiment, the barometric pressure sensor is located in a position external to the cavity and the light source and is coupled to the purge conduit. For example, as shown in FIG. 1, barometric pressure sensor 106 may be external to the light source and the cavities located therein and is coupled to purge conduit 116. The barometric pressure sensor may be coupled to the purge conduit in any suitable manner known in the art.

Light sources such as lasers can have several cavities that require pressure offset to prevent leaking air in between and contamination of any DUV components. In some embodiments, the system includes an additional barometric pressure sensor configured for measuring pressure in an additional cavity of the light source and one or more additional gas flow elements configured for controlling an amount of one or more gases in the additional cavity, and the control subsystem is configured for comparing the measured pressure in the additional cavity to a predetermined range of values for the pressure in the additional cavity, and when the measured pressure in the additional cavity is outside of the predetermined range of values for the pressure in the additional cavity, altering a parameter of at least one of the one or more additional gas flow elements based on results of comparing the measured pressure in the additional cavity. For example, as shown in FIG. 1, the system may include additional barometric pressure sensor 122 configured for measuring pressure in an additional cavity of the light source (e.g., main cavity 102). The additional gas flow element(s) include purge conduit 124 coupled to main cavity 102 and proportional valve 126 coupled to the purge conduit. The purge flow through purge conduit 124 may have any suitable parameters, which may vary depending on the cavity and the gas flow control. In one non-limiting example provided only for illustrative purposes, the purge flow out may have a volumetric flow rate of about 0.5 LPM and a pressure of about 15 psia. The purge conduit may be configured to purge the gases from the cavity out to the atmosphere.

As further shown in FIG. 1, the system includes control subsystem 128 coupled to barometric pressure sensor 122 and proportional valve 126. This control subsystem may include any suitable elements such as those described further herein that can receive a pressure measurement from the barometric pressure sensor and, based on the measured pressure, send a control signal (e.g., a control voltage between 0 and 5 V) to proportional valve 126 if the measured pressure is outside of the predetermined range. For example, the basic principle of operation of the system shown in FIG. 1 is that the control subsystem causes the proportional valve to open or close (at least partially) based on a control signal determined from the pressure measured by barometric pressure sensor 122. As a result, the internal pressure in main cavity 102 can be maintained at a stable set point (e.g., about 1 atm). Barometric pressure sensor 122, purge conduit 124, proportional valve 126, and control subsystem 128 may be further configured as described herein with respect to barometric pressure sensor 106, purge conduit 116, proportional valve 118, and control subsystem 120, respectively.

In one such embodiment, the cavity is a harmonic generation cavity of the light source, and the additional cavity is a main cavity of the light source. For example, as shown in FIG. 1, cavity 104 may be a harmonic generation cavity or another type of cavity described herein, and the additional cavity may be main cavity 102. In addition, rather than controlling the pressure in cavity 104 and optionally main cavity 102 as described above, the system may be configured to control only the main cavity pressure, and it is possible that that would be sufficient for the embodiments described herein. In such cases, the system shown in FIG. 1 may be modified so that it does not include barometric pressure sensor 106, purge conduit 116, proportional valve 118, and control subsystem 120. In such an instance, first and second gas flow conduits 108 and 112, respectively, may be coupled to main cavity 102 instead of cavity 104 as described above. The first and second gas flow conduits may be coupled to the main cavity as described above and may be configured to purge the laser head with CDA to slightly raise the pressure inside the head above 1 atm. In another option, the first and second conduits that are configured to cause a pressure inside a cavity may not be coupled to the cavities themselves, but may be coupled to only the laser head. By raising or lowering the pressure in the laser head, the pressure in the cavity or cavities may also be raised or lowered to a corresponding (or predictable) degree.

The control subsystem may be configured to control the pressure in the main cavity as described further herein (e.g., using a PID control loop). If the system includes elements that are used for separately controlling pressure in different cavities of the light source, the elements that are used for controlling pressure in one cavity may or may not have different configurations than the elements used for controlling pressure in another cavity (e.g., depending on the configurations of the cavities and the sensitivity of the generated light to pressure). Although the control subsystem shown in FIG. 1 includes two different control subsystems, each configured to control pressure in only one of the cavities, the control subsystem included in the system may include only one control subsystem configured to control pressure in more than one of the cavities. The pressures that are created and maintained in different cavities in the light source may or may not be different. For example, the stable pressures created in both of the cavities shown in FIG. 1 may be about 1 atm. However, the stable pressure created in one of the cavities may be higher or lower than the pressure created in another of the cavities. In one such example, if a first of the cavities is more sensitive to contamination, the pressure in that cavity may be higher than a second cavity to reduce any contamination from flowing from the second cavity to the first. The higher pressure in the first cavity may be selected to be the minimum pressure that can render any contamination from flowing into the cavity negligible, which will allow any pressure differentials within the light source to be kept at a minimum thereby making control and stabilization of the pressure in both cavities easier, more reliable, and more stable.

Figure 2:
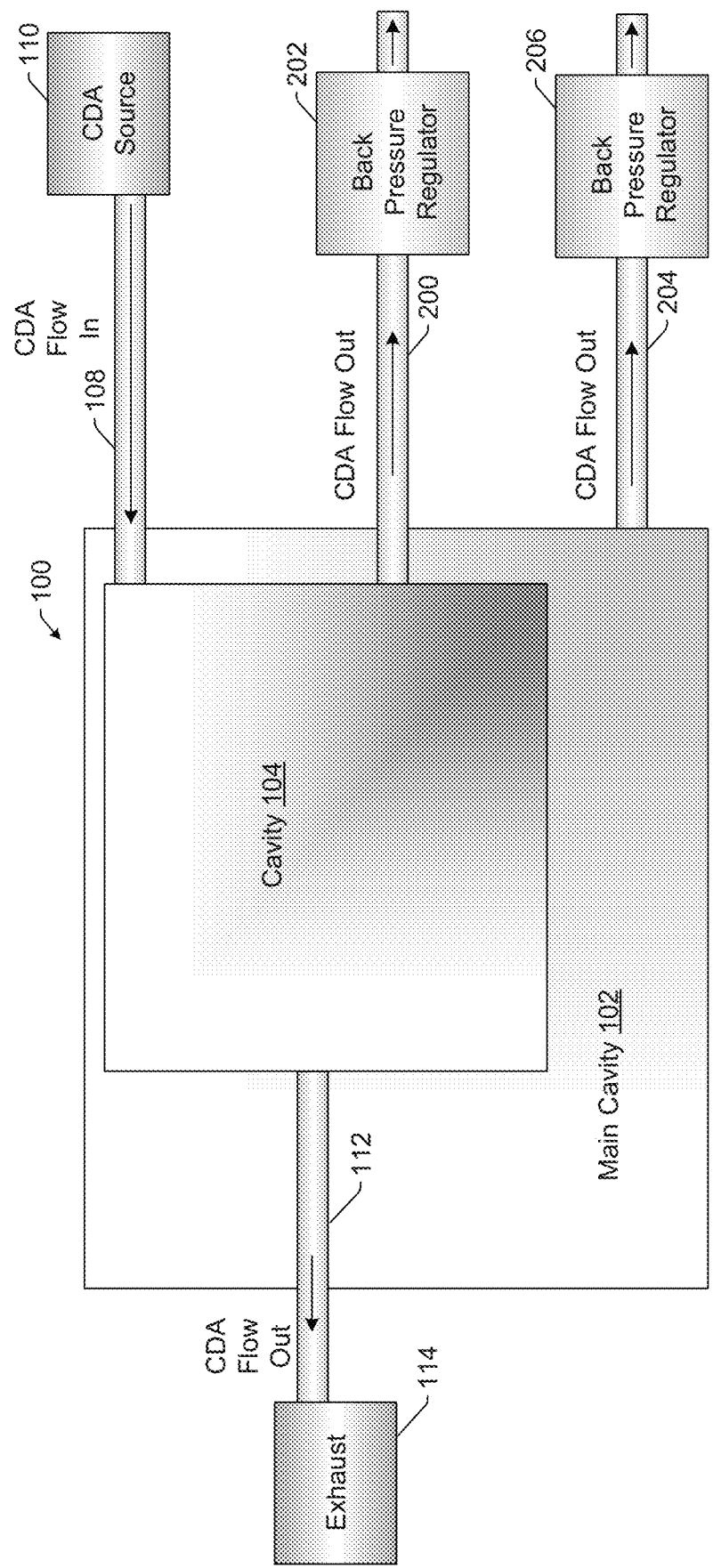

In a further such embodiment, the barometric pressure sensor, at least one of the one or more gas flow elements, and the control subsystem are included in a back pressure regulator coupled to the purge conduit, and the parameter altered by the control subsystem is a parameter of the back pressure regulator. For example, as shown in FIG. 2, purge conduit 200 may be coupled to cavity 104. Back pressure regulator 202 may be coupled to the purge conduit. Depending on which cavity or cavities of the light source are being controlled for pressure, the system shown in FIG. 2 may include one or more back pressure regulators. For example, as shown in FIG. 2, the system may include purge conduit 204 coupled to main cavity 102 and back pressure regulator 206 coupled to the purge conduit. The purge conduits and other elements shown in FIG. 2 may be further configured as described above. The back pressure regulators may have similar or different configurations, one suitable example of which is shown in FIG. 3.

Figure 3:
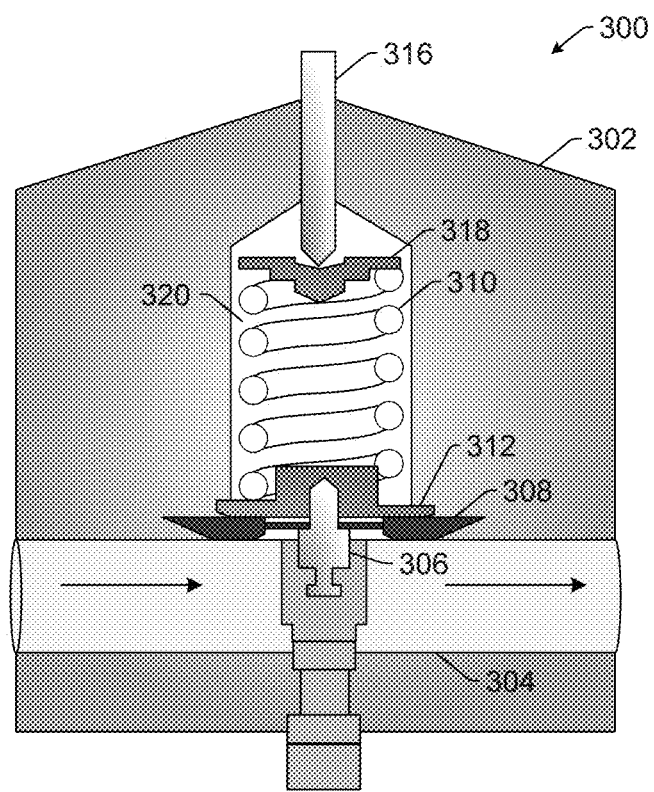
FIG. 3 is a schematic diagram illustrating a cross-sectional view of an embodiment of a back pressure regulator that may be included in the system embodiments described herein.

One embodiment of a back pressure regulator that may be used in the embodiments described herein is shown in FIG. 3. However, FIG. 3 is included herewith to only show the general elements of a back pressure regulator to thereby illustrate their function and how they can be utilized in the systems described herein. The back pressure regulator that is actually included in the system in practice may be selected from among many commercially available regulators based on the exact configuration of the light source and system in which it is included.

As shown in FIG. 3, back pressure regulator 300 may include some sort of housing 302 in which the various elements of the regulator are included and supported in their desired positional relationship to other elements. The back pressure regulator may include conduit 304 that can be coupled to the purge conduit as shown in FIG. 2 such that the gas(es) in the purge conduit can flow through the back pressure regulator, e.g., in the direction shown by the arrows in conduit 304. The back pressure regulator also includes valve plug 306 coupled to conduit 304 that operates as a negative feedback mechanism for the back pressure regulator. The valve plug is coupled to diaphragm 308 via diaphragm assembly 312, and the diaphragm functions as a barometric pressure sensor for the back pressure regulator. In this manner, in embodiments that include a back pressure regulator, the diaphragm may function as the barometric pressure sensor configured for measuring pressure in a cavity of a light source (via the coupling of the diaphragm to the cavity via the purge conduit and the valve plug).

The diaphragm may also be coupled to spring 310 via diaphragm assembly 312 so that the diaphragm can transmit the inlet pressure to the spring. The spring may act as the control subsystem of the back pressure regulator as described further herein. The spring may be coupled to adjustment screw 316 via plate 318 that constrains the other end of the spring within opening 320. The adjustment screw functions as the set point adjustment of the back pressure regulator. For example, a user or the system may be configured to set a desired pressure in the cavity of the light source via adjustment screw 316. The spring keeps the back pressure regulator in the normally closed position. For example, the spring pushes down on the diaphragm assembly, which positions the valve plug. The back pressure regulator is therefore in a constant back pressure setting and can begin regulating the pressure. The upstream pressure (in the embodiments described herein, the pressure in the cavity) is sensed beneath the diaphragm.

The back pressure regulator is designed to modulate the spring position via the valve plug to maintain a specific back pressure (in the cavity). For example, when the upstream pressure is higher than the spring setting, the spring setting will be overcome thereby compressing the spring resulting in the valve plug being moved up thereby opening the valve (only as much as necessary) to decrease the pressure. In contrast, when the upstream pressure is lower than the spring setting, the spring setting will cause the spring to expand resulting in the valve plug being moved down thereby closing the valve (only as much as necessary) to increase the pressure upstream. Therefore, in a back pressure regulator, the predetermined range of values can be set via the adjustment screw, the spring functions as the control subsystem described herein, and the valve plug functions as at least one of the gas flow elements that control an amount of one or more gases in the cavity.

Examples of commercially available back pressure regulators that may be suitable for use in embodiments described herein include those that are commercially available from CIRCOR Instrumentation, Spartanburg, S.C. Furthermore, although a spring-loaded back pressure regulator is shown in FIG. 3 as a suitable example for use in the embodiments described herein, other types of back pressure regulators may also be suitable for use in the embodiments described herein including, but not limited to, dome-loaded, air-loaded, vented, and non-vented types.

Back pressure regulators can provide a number of advantages to the embodiments described herein. For example, a correctly sized back pressure regulator can provide substantially accurate regulation, dependable performance, relatively fast response, relatively low noise, and minimum maintenance. Back pressure regulators are also advantageous because no external power is needed to operate the valve. Another advantage of back pressure regulators is that there is no need for separate measuring elements or feedback controllers. The designs of back pressure regulators tend to be relatively simple, providing relatively low cost, high reliability, and easy maintenance, thereby providing additional advantages. Furthermore, back pressure regulators are in direct contact with the controlled variable and offer substantially fast responses.

As described above, the barometric pressure sensor and the gas flow elements may be positioned external to the light source (as much as possible). However, the barometric pressure sensor and/or one or more gas flow elements may be positioned inside the light source to be an integral part of the light source, possibly with firmware controlling the operation of the gas flow element(s), e.g., via a servo loop. For example, in another embodiment, the barometric pressure sensor is located inside the cavity of the light source. In an additional embodiment, the barometric pressure sensor and at least one of the one or more gas flow elements are located inside the cavity of the light source. In one such embodiment, the control subsystem includes firmware configured for controlling operation of a servo loop. Such embodiments are illustrated in FIG. 4.

Figure 4:
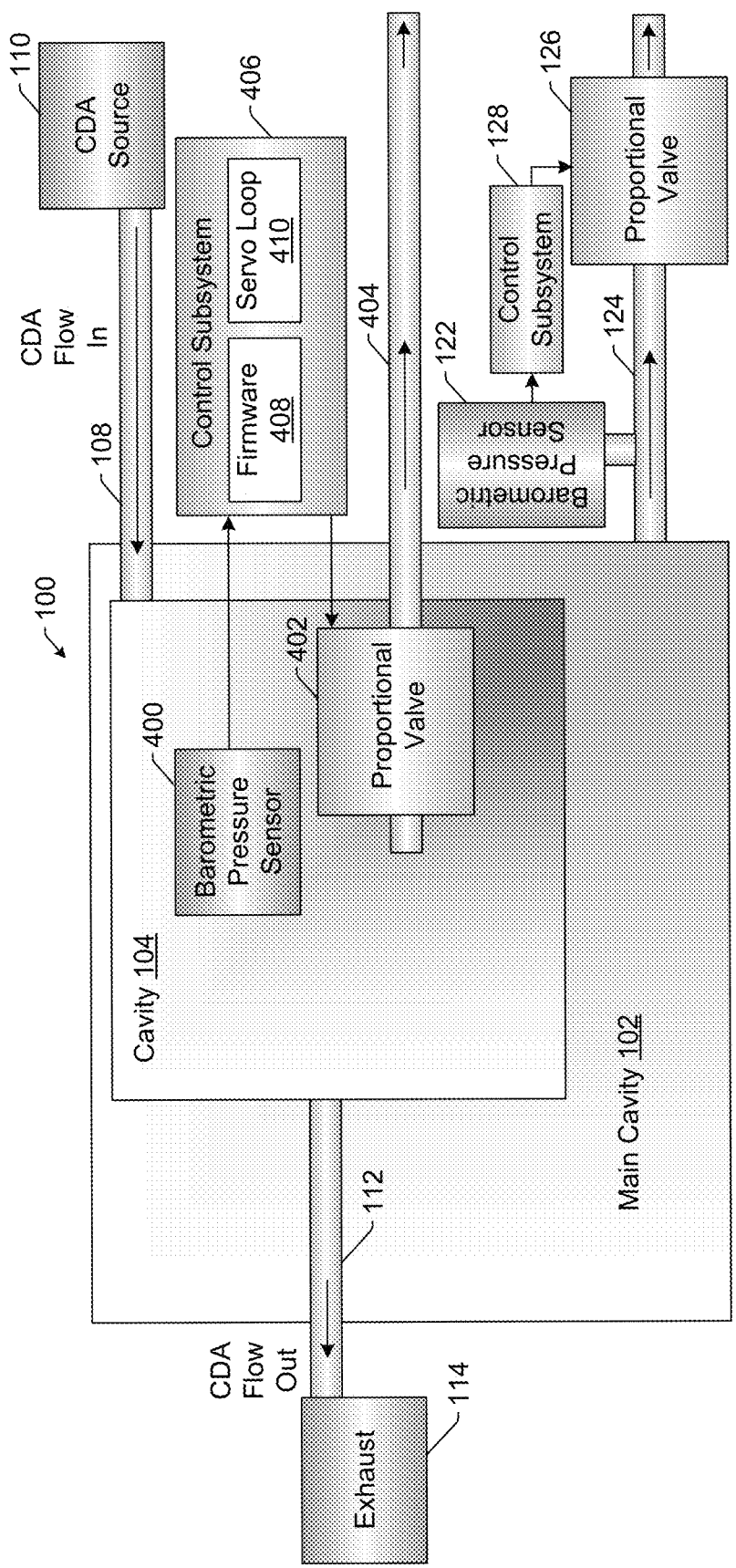

As shown in FIG. 4, barometric pressure sensor 400 may be positioned in cavity 104 of the light source. In this manner, the barometric pressure sensor is internal to the light source instead of external as shown by barometric pressure sensor 106 in FIG. 1. Although the barometric pressure sensor is shown internal to cavity 104, the barometric pressure sensor may be positioned in main cavity 102 or simply within a housing of the light source (i.e., inside the light source but external to any cavities contained therein). Barometric pressure sensor 400 may otherwise be configured as described herein.

In this embodiment, proportional valve 402 is also shown positioned inside cavity 104 and is therefore also inside the light source. However, proportional valve 402 may be positioned external to the light source (as shown by proportional valve 118 in FIG. 1) while the barometric pressure sensor is located within the cavity or the light source. Proportional valve 402 may also be internal to cavity 104 as shown in FIG. 4 or simply within a housing of the light source (i.e., inside the light source but external to any cavities contained therein). As shown in FIG. 4, if the barometric pressure sensor is located inside a cavity in the light source or inside the light source but external to any cavities contained therein, the barometric pressure sensor does not necessarily have to be coupled to a purge conduit or any other conduit because the barometric pressure sensor can simply measure the barometric pressure of the atmosphere in which it is placed, whether that is the pressure in a cavity of the light source or within the light source but external to cavities in the light source. Proportional valve 402 may, however, be coupled to purge conduit 404 as shown in FIG. 4 and as described above so that the proportional valve can alter the pressure in the cavity or housing by controlling the gas flow through the purge conduit.

As further shown in FIG. 4, control subsystem 406 may include firmware 408 and servo loop 410. The firmware and servo loop may have any suitable configuration known in the art suitable for comparing the measured pressure to a predetermined range of values for the pressure and then altering a parameter of at least one gas flow element in response thereto. As shown in FIG. 4, although barometric pressure sensor 400 and proportional valve 402 are located within cavity 104, control subsystem 406 is located external to the cavity and light source 100. As an alternative, control subsystem 404 and any elements included therein may be positioned in the light source but external to any cavities included therein or in one of the cavities themselves. Furthermore, although FIG. 4 shows one barometric pressure sensor and proportional valve inside cavity 104 and another barometric pressure sensor and proportional valve external to the light source and coupled to main cavity 102, all of the barometric pressure sensors and proportional valves shown in FIG. 4 may be positioned in their respective cavities. Specifically, one or more of barometric pressure valve 122, proportional valve 126, and control subsystem 128 may be positioned internal to main cavity 102 or inside the light source but external to any cavities contained therein in the same manner described above, and those elements may be configured for controlling the pressure in the main cavity or simply the light source itself.

The embodiments described herein have a number of advantages over other methods for controlling the operation of light sources such as those described herein. For example, the embodiments described herein provide a compensation range that is much larger than previously used compensation ranges. In addition, the embodiments described herein provide a much faster reaction time. The embodiments described herein also eliminate a need for complex compensation algorithms and reduce overall complexity of the laser system. Furthermore, the embodiments described herein enable the manufacture of more reliable lasers of any type with higher reliability and longer lifetimes at higher output powers, which are critical for the types of systems described further herein in which the light sources described herein may be used.

In one embodiment, the system also includes an illumination subsystem configured for directing light generated by the light source to a specimen, a detection subsystem configured for detecting light from the specimen, and a computer subsystem configured for detecting defects on the specimen based on output responsive to the detected light generated by the detection subsystem. For example, the light source may be included in an illumination subsystem such as that described below. The detection subsystem and computer subsystem may be further configured as described below.

In one such embodiment, the specimen is a wafer. The wafer may include any wafer known in the semiconductor arts. Although some embodiments may be described herein with respect to a wafer or wafers, the embodiments are not limited in the specimen for which they can be used. For example, the embodiments described herein may be used for specimens such as reticles, flat panels, personal computer (PC) boards, and other semiconductor specimens.

Figure 5:
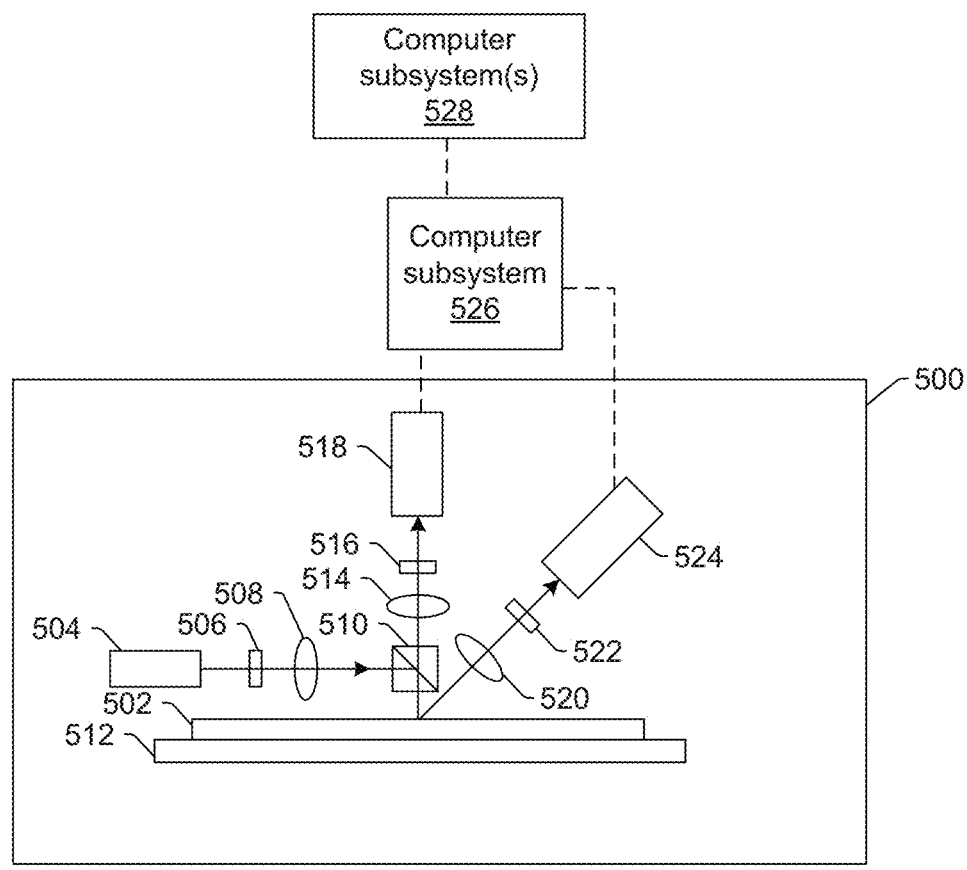
FIG. 5 is a schematic diagram illustrating a side view of an embodiment of an optical system that includes a light source in which the pressure may be controlled by an embodiment of a system configured as described herein.

One configuration that may be used for the system embodiments described herein is shown in FIG. 5. The system includes optical (light-based) subsystem 500 that includes at least an illumination subsystem that includes a light source and a detection subsystem that includes a detector. The light source is configured to generate light that is directed to a specimen. The detector is configured to detect light from the specimen and to generate output responsive to the detected light. The system embodiment shown in FIG. 5 may also be configured for performing a light-based process, inspection process, and metrology process as described further herein.

The illumination subsystem includes at least one light source, whose pressure is controlled as described further herein. For example, as shown in FIG. 5, the illumination subsystem includes light source 504. Light source 504 may be configured and coupled to other elements as described and shown in FIGS. 1, 2, and 4. In one embodiment, the illumination subsystem is configured to direct light generated by the light source to the specimen at one or more angles of incidence, which may include one or more oblique angles and/or one or more normal angles. For example, as shown in FIG. 5, light from light source 504 is directed through optical element 506 and then lens 508 to beam splitter 510, which directs the light to specimen 502 at a normal angle of incidence. The angle of incidence may include any suitable angle of incidence, which may vary depending on, for instance, characteristics of the specimen and the process to be performed on the specimen.

The illumination subsystem may be configured to direct the light to the specimen at different angles of incidence at different times. For example, the optical subsystem may be configured to alter one or more characteristics of one or more elements of the illumination subsystem such that the light can be directed to the specimen at an angle of incidence that is different than that shown in FIG. 5. In one such example, the optical subsystem may be configured to move light source 504, optical element 506, and lens 508 such that the light is directed to the specimen at a different angle of incidence.

In some instances, the optical subsystem may be configured to direct light to the specimen at more than one angle of incidence at the same time. For example, the illumination subsystem may include more than one illumination channel, one of the illumination channels may include light source 504, optical element 506, and lens 508 as shown in FIG. 5 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 504 shown in FIG. 5) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 506 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

Light source 504 may be any suitable laser known in the art configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 506 may be focused to beam splitter 510 by lens 508. Although lens 508 is shown in FIG. 5 as a single refractive optical element, in practice, lens 508 may include a number of refractive and/or reflective optical elements that in combination focus the light from the optical element to the specimen. The illumination subsystem shown in FIG. 5 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used.

The optical subsystem may also include a scanning subsystem configured to cause the light to be scanned over the specimen. For example, the optical subsystem may include stage 512 on which specimen 502 is disposed. The scanning subsystem may include any suitable mechanical and/or robotic assembly (that includes stage 512) that can be configured to move the specimen such that the light can be scanned over the specimen. In addition, or alternatively, the optical subsystem may be configured such that one or more optical elements of the optical subsystem perform some scanning of the light over the specimen. The light may be scanned over the specimen in any suitable fashion.

The detection subsystem may include one or more detection channels. At least one of the detection channel(s) includes a detector configured to detect light from the specimen due to illumination of the specimen by the illumination subsystem and to generate output responsive to the detected light. For example, the detection subsystem shown in FIG. 5 includes two detection channels, one formed by collector 514, element 516, and detector 518 and another formed by collector 520, element 522, and detector 524. As shown in FIG. 5, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 5 shows an embodiment of the detection subsystem that includes two detection channels, the detection subsystem may include a different number of detection channels (e.g., only one detection channel or two or more detection channels). Although each of the collectors are shown in FIG. 5 as single refractive optical elements, each of the collectors may include one or more refractive optical element(s) and/or one or more reflective optical element(s).

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 526 of the system may be configured to generate images of the specimen from the non-imaging output of the detectors. However, in other instances, the detectors may be configured as imaging detectors that are configured to generate imaging signals or image data. Therefore, the system may be configured to generate output and/or images described herein in a number of ways.

It is noted that FIG. 5 is provided herein to generally illustrate a configuration of illumination and detection subsystems that may be included in the system embodiments described herein. Obviously, the illumination and detection subsystem configurations described herein may be altered to optimize the performance of the system as is normally performed when designing a commercial system. In addition, the systems described herein may be implemented using an existing optical system (e.g., by adding functionality described herein to an existing optical system) such as the 29xx, 39xx, Voyager™, and Puma™ series of tools that are commercially available from KLA Corp., Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 526 of the system may be coupled to the detectors of the detection subsystem in any suitable manner (e.g., via one or more transmission media, which may include "wired" and/or "wireless" transmission media) such that the computer subsystem can receive the output, images, etc. generated by the detectors during scanning of the specimen. Computer subsystem 526 may be configured to perform a number of functions using the output, images, etc. of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 526 may be coupled to computer subsystem(s) 528 (as shown by the dashed line in FIG. 5) by any suitable transmission media, which may include any suitable wired and/or wireless transmission media known in the art. Two or more of such computer subsystems may also be effectively coupled by a shared computer-readable storage medium (not shown).

The computer subsystem(s) may be configured for detecting defects on the specimen by applying a defect detection method to the output generated by the detector(s). Detecting defects on the specimen may be performed in any suitable manner known in the art (e.g., applying a defect detection threshold to the output and determining that any output having a value above the threshold corresponds to a defect or a potential defect) with any suitable defect detection method and/or algorithm.

As described above, the computer subsystem may use the output generated by the detector(s) to detect defects on the specimen. In this manner, the system described herein may be configured as an inspection system. In another embodiment, the system described herein may be configured as a metrology or defect review system. In particular, the embodiment of the system described herein and shown in FIG. 5 may be modified in one or more parameters to provide different imaging capability depending on the application for which it will be used. In one such example, the optical subsystem shown in FIG. 5 may be configured to have a higher resolution if it is to be used for metrology rather than for inspection. In other words, the embodiments of the subsystems shown in FIG. 5 describe some general and various configurations for an optical subsystem that can be tailored in a number of manners that will be obvious to one skilled in the art to produce systems having different imaging capabilities that are more or less suitable for different applications.

Each of the embodiments of the system may be further configured according to any other embodiment(s) described herein. The embodiments described herein may also be further configured as described in U.S. Pat. No. 9,116,445 to Germanenko et al. issued Aug. 25, 2015, which is incorporated by reference as if fully set forth herein.

Figure 6:
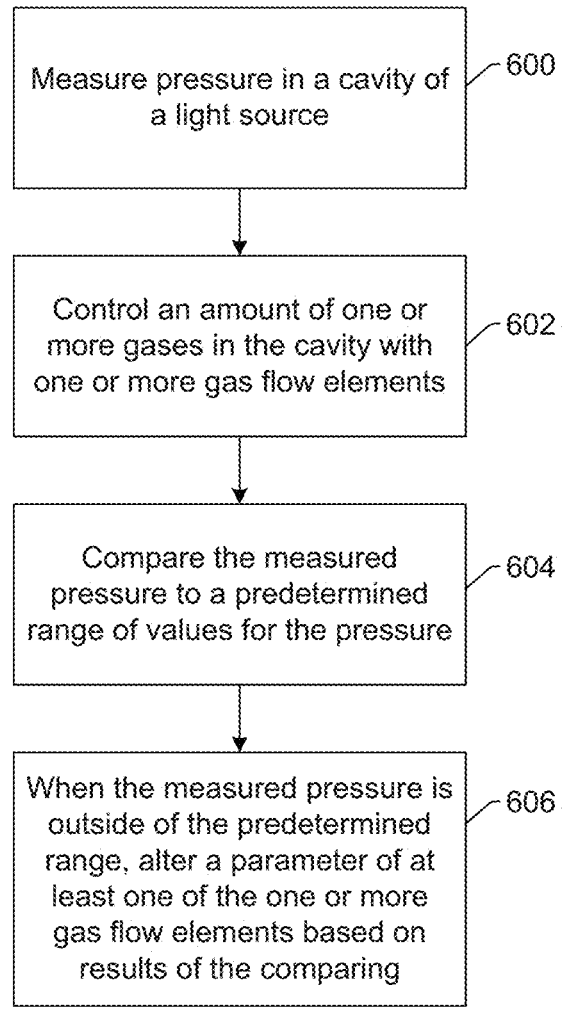
FIG. 6 is a flow chart illustrating one embodiment of steps included in a method for controlling pressure in a cavity of a light source.

Another embodiment relates to a computer-implemented method for controlling pressure in a cavity of a light source. The method includes measuring pressure in a cavity of a light source, as shown in step 600 of FIG. 6. The method also includes controlling an amount of one or more gases in the cavity with one or more gas flow elements, as shown in step 602 of FIG. 6. In addition, the method includes comparing the measured pressure to a predetermined range of values for the pressure, as shown in step 604 of FIG. 6. When the measured pressure is outside of the predetermined range, the method includes altering a parameter of at least one of the one or more gas flow elements based on results of the comparing, as shown in step 606 of FIG. 6. Each of the steps of the method may be performed as described further herein. The method may also include any other step(s) that can be performed by the system(s) described herein. The steps of the method may be performed by the systems described herein, which may be configured according to any of the embodiments described herein.

Figure 7:
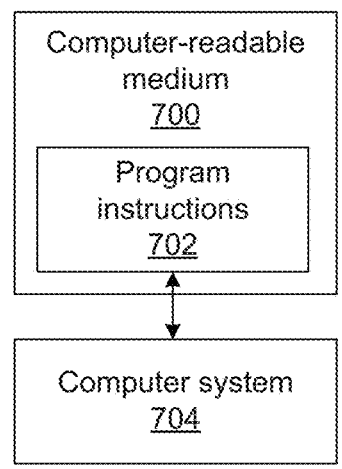
FIG. 7 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for controlling pressure in a cavity of a light source. One such embodiment is shown in FIG. 7. In particular, as shown in FIG. 7, non-transitory computer-readable medium 700 includes program instructions 702 executable on computer system 704. The computer-implemented method may include any step(s) of any method(s) described herein.

Program instructions 702 implementing methods such as those described herein may be stored on computer-readable medium 700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 704 may be configured according to any of the embodiments described herein.

Further modifications and alternative embodiments of various aspects of the invention will be apparent to those skilled in the art in view of this description. For example, methods and systems for controlling pressure in a cavity of a light source are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to control pressure in a cavity of a light source, comprising:
   a barometric pressure sensor configured for measuring pressure in a cavity of a light source;
   one or more gas flow elements configured for controlling an amount of one or more gases in the cavity, wherein the one or more gas flow elements comprise: a first gas flow conduit coupled to the cavity and a clean dry air source; and a second gas flow conduit coupled to the cavity and an exhaust, wherein the first and second gas flow conduits, the clean dry air source, and the exhaust are configured to cause a positive pressure in the cavity, and wherein the one or more gas flow elements further comprise a purge conduit coupled to the cavity and a proportional valve coupled to the purge conduit; and
   a control subsystem configured for comparing the measured pressure to a predetermined range of values for the pressure and, when the measured pressure is outside of the predetermined range, altering a parameter of at least one of the one or more gas flow elements based on results of said comparing, wherein the parameter altered by the control subsystem comprises a parameter of the proportional valve.

2. The system of claim 1, further comprising an illumination subsystem configured for directing light generated by the light source to a specimen, a detection subsystem configured for detecting light from the specimen, and a computer subsystem configured for detecting defects on the specimen based on output responsive to the detected light generated by the detection subsystem.

3. The system of claim 2, wherein the specimen is a wafer.

4. The system of claim 1, wherein the light source is a laser configured to generate single wavelength light.

5. The system of claim 1, wherein the light source is a laser configured to generate narrowband light.

6. The system of claim 1, wherein the cavity is a harmonic generation cavity of the light source.

7. The system of claim 1, wherein the cavity is an infrared cavity of the light source.

8. The system of claim 1, wherein the cavity is a main cavity of the light source.

9. The system of claim 1, wherein the barometric pressure sensor is located in a position external to the cavity and the light source and is coupled to the purge conduit.

10. The system of claim 1, wherein the barometric pressure sensor, at least one of the one or more gas flow elements, and the control subsystem are included in a back pressure regulator coupled to the purge conduit, and wherein the parameter altered by the control subsystem comprises a parameter of the back pressure regulator.

11. The system of claim 1, further comprising an additional barometric pressure sensor configured for measuring pressure in an additional cavity of the light source and one or more additional gas flow elements configured for controlling an amount of one or more gases in the additional cavity, wherein the control subsystem is further configured for comparing the measured pressure in the additional cavity to a predetermined range of values for the pressure in the additional cavity, and when the measured pressure in the additional cavity is outside of the predetermined range of values for the pressure in the additional cavity, altering a parameter of at least one of the one or more additional gas flow elements based on results of comparing the measured pressure in the additional cavity.

12. The system of claim 11, wherein the cavity is a harmonic generation cavity of the light source, and wherein the additional cavity is a main cavity of the light source.

13. The system of claim 1, wherein the control subsystem is further configured for altering the parameter using a proportional-integral-derivative control loop.

14. The system of claim 1, wherein the barometric pressure sensor is located inside the cavity of the light source.

15. The system of claim 1, wherein the barometric pressure sensor and at least one of the one or more gas flow elements are located inside the cavity of the light source.

16. The system of claim 15, wherein the control subsystem comprises firmware configured for controlling operation of a servo loop.

17. A non-transitory computer-readable medium, storing program instructions executable on a computer system for performing a computer-implemented method for controlling pressure in a cavity of a light source, wherein the computer-implemented method comprises:
    measuring pressure in a cavity of a light source;
    controlling an amount of one or more gases in the cavity with one or more gas flow elements, wherein the one or more gas flow elements comprise: a first gas flow conduit coupled to the cavity and a clean dry air source; and a second gas flow conduit coupled to the cavity and an exhaust, wherein the first and second gas flow conduits, the clean dry air source, and the exhaust are configured to cause a positive pressure in the cavity, and wherein the one or more gas flow elements further comprise a purge conduit coupled to the cavity and a proportional valve coupled to the purge conduit;
    comparing the measured pressure to a predetermined range of values for the pressure; and
    when the measured pressure is outside of the predetermined range, altering a parameter of at least one of the one or more gas flow elements based on results of the comparing, wherein the parameter altered by the control subsystem comprises a parameter of the proportional valve.

18. A computer-implemented method for controlling pressure in a cavity of a light source, comprising:
    measuring pressure in a cavity of a light source;
    controlling an amount of one or more gases in the cavity with one or more gas flow elements, wherein the one or more gas flow elements comprise: a first gas flow conduit coupled to the cavity and a clean dry air source; and a second gas flow conduit coupled to the cavity and an exhaust, wherein the first and second gas flow conduits, the clean dry air source, and the exhaust are configured to cause a positive pressure in the cavity, and wherein the one or more gas flow elements further comprise a purge conduit coupled to the cavity and a proportional valve coupled to the purge conduit;
    comparing the measured pressure to a predetermined range of values for the pressure; and
    when the measured pressure is outside of the predetermined range, altering a parameter of at least one of the one or more gas flow elements based on results of the comparing, wherein the parameter altered by the control subsystem comprises a parameter of the proportional valve.

19. A system configured to control pressure in a cavity of a light source, comprising:
    a barometric pressure sensor configured for measuring pressure in a cavity of a light source;
    one or more gas flow elements configured for controlling an amount of one or more gases in the cavity;
    a control subsystem configured for comparing the measured pressure to a predetermined range of values for the pressure and, when the measured pressure is outside of the predetermined range, altering a parameter of at least one of the one or more gas flow elements based on results of said comparing;
    an illumination subsystem configured for directing light generated by the light source to a specimen;
    a detection subsystem configured for detecting light from the specimen; and
    a computer subsystem configured for detecting defects on the specimen based on output responsive to the detected light generated by the detection subsystem.

20. The system of claim 19, wherein the specimen is a wafer.

21. The system of claim 19, wherein the light source is a laser configured to generate single wavelength light.

22. The system of claim 19, wherein the light source is a laser configured to generate narrowband light.

23. The system of claim 19, wherein the cavity is a harmonic generation cavity of the light source.

24. The system of claim 19, wherein the cavity is an infrared cavity of the light source.

25. The system of claim 19, wherein the cavity is a main cavity of the light source.

26. A system configured to control pressure in a cavity of a light source, comprising:
    a barometric pressure sensor configured for measuring pressure in a cavity of a light source;
    one or more gas flow elements configured for controlling an amount of one or more gases in the cavity, wherein the one or more gas flow elements comprise: a first gas flow conduit coupled to the cavity and a clean dry air source; and a second gas flow conduit coupled to the cavity and an exhaust, wherein the first and second gas flow conduits, the clean dry air source, and the exhaust are configured to cause a positive pressure in the cavity, and wherein the one or more gas flow elements further comprise a purge conduit coupled to the cavity and a back pressure regulator coupled to the purge conduit; and
    a control subsystem configured for comparing the measured pressure to a predetermined range of values for the pressure and, when the measured pressure is outside of the predetermined range, altering a parameter of at least one of the one or more gas flow elements based on results of said comparing, wherein the parameter altered by the control subsystem comprises a parameter of the back pressure regulator.

* * * * *